(12) United States Patent
Oh et al.

(10) Patent No.: US 12,123,903 B2
(45) Date of Patent: Oct. 22, 2024

(54) STATIC ELECTRICITY VISUALIZATION DEVICE

(71) Applicant: SEMES CO., LTD., Chungcheongnam-do (KR)

(72) Inventors: Jun Ho Oh, Gyeonggi-do (KR); Kwang Sup Kim, Chungcheongnam-do (KR); Jae Hong Kim, Chungcheongnam-do (KR); Kyung Hun Jang, Jeollabuk-do (KR); Young Ho Park, Incheon (KR); Jong Min Lee, Gyeonggi-do (KR); Yeon Chul Song, Seoul (KR); Sang Min Ha, Gyeonggi-do (KR); Ji Hoon Yoo, Gyeonggi-do (KR); Myeong Jun Lim, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 315 days.

(21) Appl. No.: 17/837,027

(22) Filed: Jun. 10, 2022

(65) Prior Publication Data

US 2023/0204648 A1 Jun. 29, 2023

(30) Foreign Application Priority Data

Dec. 29, 2021 (KR) .......................... 10-2021-0191358

(51) Int. Cl.
*G01R 29/24* (2006.01)
(52) U.S. Cl.
CPC ..................... *G01R 29/24* (2013.01)
(58) Field of Classification Search
CPC .... G01R 29/24; G01R 29/0878; G01R 13/02; G01R 29/0871; G06T 11/001;
(Continued)

(56) References Cited

U.S. PATENT DOCUMENTS 7,629,400 B2 * 12/2009 Hyman ................... B41M 5/36
524/106
10,949,704 B2 3/2021 Jeong
(Continued)

FOREIGN PATENT DOCUMENTS

JP 2006-10365 1/2006
KR 10-2013-0089122 8/2013
(Continued)

OTHER PUBLICATIONS

Office Action dated Jan. 22, 2024 for Korean Patent Application No. 10-2021-0191358 and its English translation from Global Dossier.

*Primary Examiner* — Jermele M Hollington
*Assistant Examiner* — Zannatul Ferdous
(74) *Attorney, Agent, or Firm* — Womble Bond Dickinson (US) LLP

(57) ABSTRACT

A static electricity visualization apparatus capable of visually identifying a measured level of static electricity is provided. The static electricity visualization apparatus comprises a photographing unit for generating a first photographed image obtained by photographing a measurement target at a first distance from the measurement target in a first mode, and generating a second photographed image obtained by photographing the measurement target at a second distance from the measurement target in a second mode, a static electricity sensor for measuring a static electricity level of the measurement target at the second distance from the measurement target, a processor for matching the second photographed image with the first photographed image, and an output unit for outputting a static electricity visualization image that visualizes a static electricity level measured by the static electricity sensor on the first photographed image, wherein the static electricity visualization image comprises a color corresponding to the static electricity level of the measurement target measured (Continued)

by the static electricity sensor at a position where the second photographed image matches on the first photographed image.

20 Claims, 16 Drawing Sheets

(58) Field of Classification Search
CPC .... G01D 21/02; G06V 10/751; G01B 11/026; H04N 7/18; H04N 23/57
See application file for complete search history.

(56) References Cited

U.S. PATENT DOCUMENTS

| | | | |
|---|---|---|---|
| 2014/0375652 A1* | 12/2014 | Jeon | G06T 11/206 345/440 |
| 2016/0175091 A1* | 6/2016 | Van Heugten | A61F 2/14 623/6.22 |
| 2018/0330973 A1* | 11/2018 | Wu | H01L 22/14 |
| 2019/0113324 A1* | 4/2019 | Hwang | G01P 15/0802 |
| 2021/0223037 A1* | 7/2021 | Sohn | G06T 7/0004 |
| 2023/0116619 A1* | 4/2023 | Oh | G01R 29/14 345/593 |

FOREIGN PATENT DOCUMENTS

| | | |
|---|---|---|
| KR | 10-2016-0044387 | 4/2016 |
| KR | 10-1793919 | 11/2017 |
| KR | 10-2019891 | 9/2019 |
| KR | 10-2020-0042226 | 4/2020 |
| KR | 10-2289640 | 8/2021 |

* cited by examiner

STATIC ELECTRICITY VISUALIZATION DEVICE

This application claims the benefit of Korean Patent Application No. 10-2021-0191358, filed on Dec. 29, 2021, in the Korean Intellectual Property Office, the disclosure of which is incorporated herein by reference in its entirety.

BACKGROUND

1. Field

The present disclosure relates to a static electricity visualization apparatus.

2. Description of the Related Art

Static electricity is formed when electric charges generated by electric charging are accumulated without being discharged due to the large resistance of the surface of the charged object. This is one of the important problems to be solved in order to improve the yield in a semiconductor manufacturing process using an insulator substrate.

Static electricity, which is formed due to various reasons, is the main cause of particle defects by collecting particles on the substrate during the manufacturing process. When a discharge is generated due to static electricity, the potential of the static electricity has a level of several hundred or several thousand volts A substrate, on which a highly integrated chip is formed, may be seriously affected by device destruction even by a charging potential of several tens of volts. Accordingly, there is an increased need to measure and control static electricity generated in the substrate processing apparatus.

SUMMARY

An object of the present disclosure is to provide a static electricity visualization apparatus capable of visually identifying a measured level of static electricity.

The objects of the present disclosure are not limited to the objects mentioned above, and other objects not mentioned will be clearly understood by those skilled in the art from the following description.

One aspect of the static electricity visualization apparatus according to the present disclosure for achieving the above technical object comprises a photographing unit for generating a first photographed image obtained by photographing a measurement target at a first distance from the measurement target in a first mode, and generating a second photographed image obtained by photographing the measurement target at a second distance from the measurement target in a second mode, a static electricity sensor for measuring a static electricity level of the measurement target at the second distance from the measurement target, a processor for matching the second photographed image with the first photographed image, and an output unit for outputting a static electricity visualization image that visualizes a static electricity level measured by the static electricity sensor on the first photographed image, wherein the static electricity visualization image comprises a color corresponding to the static electricity level of the measurement target measured by the static electricity sensor at a position where the second photographed image matches on the first photographed image.

The apparatus further comprises a distance sensor for measuring a distance between the measurement target and the static electricity sensor, wherein the static electricity sensor, in response to the second distance between the measurement target and the static electricity sensor being equal to or less than a threshold value, provides data regarding the measured static electricity level to the processor.

The apparatus further comprises an integrated sensor including the photographing unit, the static electricity sensor, the output unit, and the distance sensor, wherein the processor controls the integrated sensor.

Wherein the first distance is greater than the second distance.

The apparatus further comprises an image processing unit for pre-processing the first photographed image and the second photographed image.

Wherein the processor matches the second photographed image on the first photographed image by using a template matching algorithm.

Wherein the processor receives the first photographed image and the second photographed image from the photographing unit, and receives data regarding the static electricity level measured from the static electricity sensor, and generates the static electricity visualization image, in which a color corresponding to the static electricity level measured by the static electricity sensor is displayed at a position where the second photographed image matches on the first photographed image.

The apparatus further comprises a memory for storing color data corresponding to a static electricity level measured by the static electricity sensor, wherein the processor generates the static electricity visualization image by using the color data stored in the memory.

Wherein the output unit outputs a static electricity level of the measurement target measured by the static electricity sensor as a numerical value.

Another aspect of the static electricity visualization apparatus according to the present disclosure for achieving the above technical object comprises a photographing unit for generating a first photographed image obtained by photographing an entire image of a measurement target in a first mode, and generating a second photographed image obtained by photographing a partial image including a specific position of the measurement target in a second mode, a static electricity sensor for measuring a static electricity level at the specific position of the measurement target, an integrated sensor including an output unit for outputting a static electricity visualization image that visualizes a static electricity level measured by the static electricity sensor on the first photographed image, and a processor for controlling the integrated sensor and matching the second photographed image with the first photographed image, wherein the static electricity visualization image comprises a color corresponding to a static electricity level of the measurement target measured by the static electricity sensor at a position where the second photographed image matches on the first photographed image.

Wherein the integrated sensor further comprises a distance sensor measuring a distance between the measurement target and the static electricity sensor.

Wherein the electrostatic sensor, in response to a distance between the measurement target and the static electricity sensor measured by the distance sensor being less than or equal to a threshold value, provides data regarding the static electricity level to the processor.

Wherein the processor matches the second photographed image on the first photographed image by using a template matching algorithm.

The apparatus further comprises an image processing unit for pre-processing the first photographed image and the second photographed image.

Wherein the processor receives the first photographed image and the second photographed image from the photographing unit, receives data regarding the static electricity level measured from the static electricity sensor, generates the static electricity visualization image, in which a color corresponding to a static electricity level measured by the static electricity sensor is displayed at a position where the second photographed image matches on the first photographed image, and provides the generated static electricity visualization image to the output unit.

The apparatus further comprises a memory for storing color data corresponding to a static electricity level measured by the static electricity sensor, wherein the processor generates the static electricity visualization image by using the color data stored in the memory.

Wherein the static electricity sensor measures a static electricity level at the specific position of the measurement target in response to the photographing unit photographing the partial image to generate the second photographed image.

Another aspect of the static electricity visualization apparatus according to the present disclosure for achieving the above technical object comprises a photographing unit for generating a first photographed image obtained by photographing an entire image of a measurement target in a first mode, and generating a second photographed image obtained by photographing a partial image including a specific position of the measurement target in a second mode, a static electricity sensor for measuring a static electricity level at the specific position of the measurement target, an output unit for outputting a static electricity visualization image, in which a static electricity level measured by the static electricity sensor is visualized on the first photographed image, an integrated sensor comprising a distance sensor for measuring a distance between the measurement target and the static electricity sensor, and a processor for controlling the integrated sensor and matching the second photographed image with the first photographed image, wherein the static electricity sensor, in response to a distance between the measurement target and the static electricity sensor measured by the distance sensor being less than or equal to a threshold value, provide data regarding the static electricity level to the processor, wherein the processor receives the first photographed image and the second photographed image from the photographing unit, receives data regarding the static electricity level measured from the static electricity sensor, generates the static electricity visualization image, in which a color corresponding to a static electricity level measured by the static electricity sensor is displayed at a position where the second photographed image matches on the first photographed image, and provides the generated static electricity visualization image to the output unit.

Wherein the processor matches the second photographed image on the first photographed image by using a template matching algorithm.

Wherein the static electricity sensor, in response to the photographing unit photographing the partial image to generate the second photographed image, measures a static electricity level at the specific position of the measurement target.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
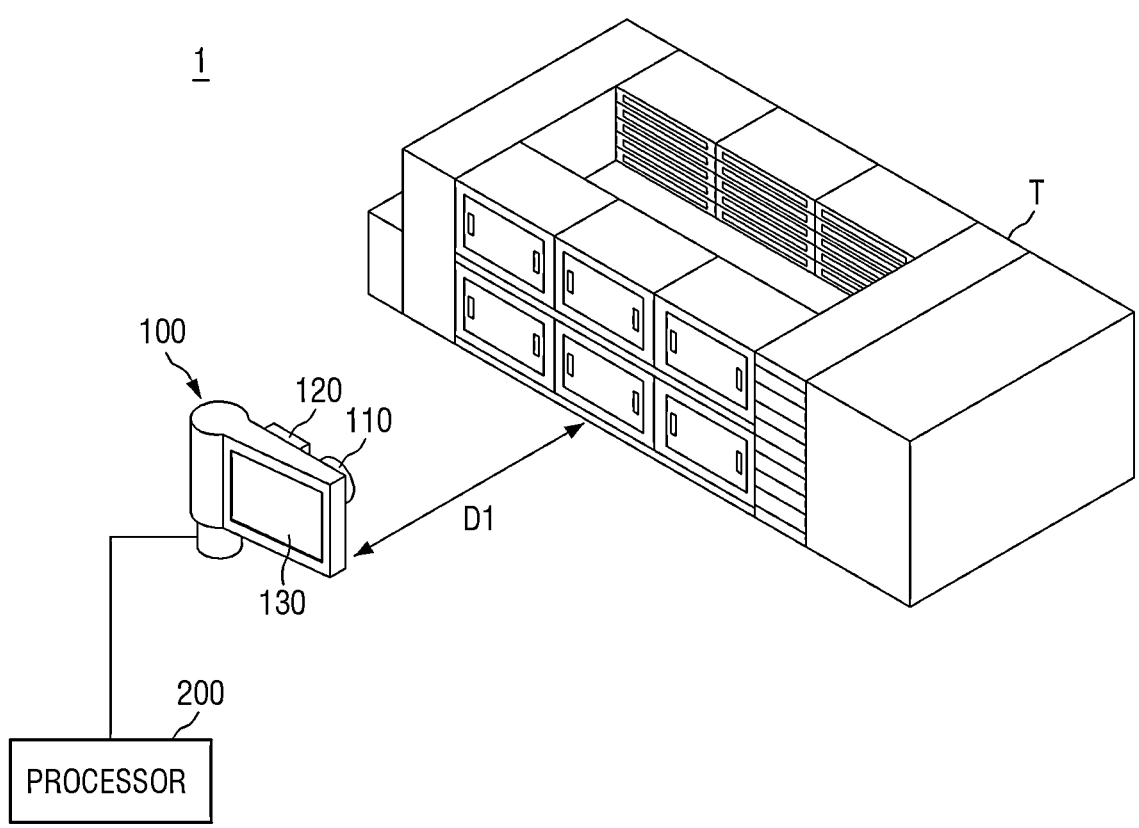
FIG. 1 is a view for describing an apparatus for static electricity visualization according to an embodiment of the present disclosure.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present disclosure belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

Figure 2:
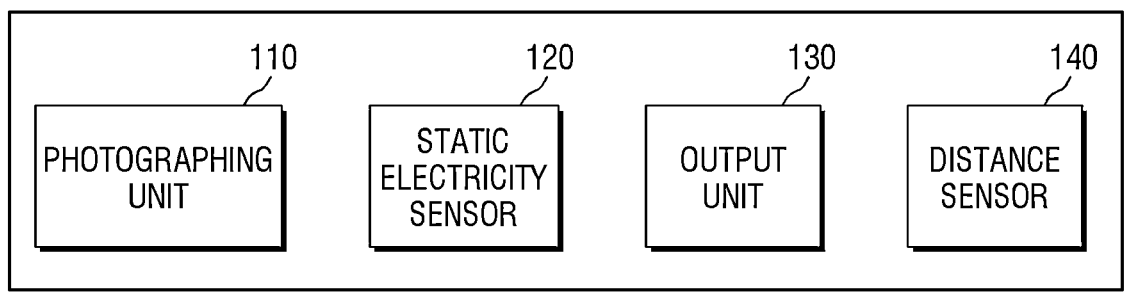
FIG. 2 is a view for describing an integrated sensor of the static electricity visualization apparatus according to an embodiment of the present disclosure.

FIG. 1 is a view for describing an apparatus for static electricity visualization according to an embodiment of the present disclosure. FIG. 2 is a view for describing an integrated sensor of the static electricity visualization apparatus according to an embodiment of the present disclosure.

Referring to FIGS. 1 and 2, the static electricity visualization apparatus 1 according to an embodiment includes an integrated sensor 100 and a processor 200.

The integrated sensor 100 includes a photographing unit 110, a static electricity sensor 120, an output unit 130, and a distance sensor 140.

The integrated sensor 100 may photograph the measurement target T and measure static electricity of the measurement target T. Also, the integrated sensor 100 may output an image visually indicating the static electricity level of the measurement target T. The integrated sensor 100 is portable and may measure the static electricity level at a plurality of positions of the measurement target T.

The photographing unit 110 may photograph the measurement target T. The photographing unit 110 may transmit an image obtained by photographing the measurement target T to the processor 200.

The photographing unit 110 may photograph the measurement target T as a whole in the first mode. Specifically, the photographing unit 110 may photograph the measurement target T as a whole at the first distance D1 from the measurement target T in the first mode. The photographing unit 110 may generate a first photographed image including the entire image of the measurement target T in the first mode.

The photographing unit 110 may photograph a part of the measurement target T in the second mode. Specifically, the photographing unit 110 may locally photograph a specific portion of the measurement target T at the second distance D2 from the measurement target T in the second mode. The photographing unit 110 may generate a second photographed image including a partial image of the measurement target T in the second mode.

The static electricity sensor 120 may measure the static electricity level of the measurement target T. The static electricity sensor 120 may measure the level of static electricity detected at a position installed on the surface of the measurement target T. In FIG. 1, the measurement target T is illustrated as an apparatus for processing a substrate, but the embodiment is not limited thereto. For example, the measurement target T, on which the static electricity sensor 120 is installed, may include an industrial facility other than a substrate processing apparatus.

The static electricity sensor 120 may measure the static electricity level of the measurement target T when the photographing unit 110 photographs a partial image of the measurement target T in the second mode. Specifically, when the integrated sensor 100 is aligned with a specific position of the measurement target T in order for the photographing unit 110 to photograph a partial image of the measurement target T in the second mode, the static electricity sensor 120 may measure the static electricity level detected at that specific position. That is, when the integrated sensor 100 is aligned at a specific position in order for the static electricity sensor 120 to measure the static electricity level detected at a specific position of the measurement target T, the photographing unit 110 may photograph the specific position. In this case, the photographing unit 110 may generate a second photographed image including an image of a specific position. When the integrated sensor 100 is aligned with a specific position of the measurement target T, and the photographing unit 110 generates a second photographed image including a partial image of the measurement target T, the static electricity sensor 120 may measure the static electricity level at a specific position of the measurement target T.

The static electricity sensor 120 may provide the processor 200 with the static electricity level measured at a specific position of the measurement target T, in which the integrated sensor 100 is aligned. Specifically, the static electricity sensor 120 provides the measured static electricity level to the processor 200 when the distance between the integrated sensor 100 and the measurement target T measured by the distance sensor 140 is less than or equal to a threshold value.

The output unit 130 may output a first photographed image including the entire image of the measurement target T generated by the photographing unit 110 in the first mode. The output unit 130 may output a second photographed image including a partial image of the measurement target T generated by the photographing unit 110 in the second mode.

The output unit 130 may output the static electricity visualization image provided from the processor 200. The output unit 130 may output a static electricity visualization image, in which the static electricity level measured at a matched position is visually expressed at a position where the second photographed image photographed by the photographing unit 110 in the second mode matches in the first photographed image photographed by the photographing unit 110 in the first mode. Specifically, on the entire image of the measurement target T photographed by the photographing unit 110 in the first mode, at a specific position of the measurement target T photographed by the photographing unit 110 in the second mode, the output unit 130 may output a static electricity visualization image, in which a color corresponding to the static electricity level measured at the specific position is displayed. That is, on the entire image of the measurement target T, at a specific position where the partial image of the measurement target T photographed in the second mode is matched, the output unit 13 may visually indicate the static electricity level of the measurement target T measured at the specific position.

The distance sensor 140 may measure a distance between the integrated sensor 100 and the measurement target T. Specifically, when the photographing unit 110 generates a second photographed image including a partial image of the measurement target T by photographing a specific position of the measurement target T in the second mode, the distance sensor 140 may measure the distance between the integrated sensor 100 and the measurement target T. That is, the distance sensor 140 may measure the distance between the integrated sensor 100 and the measurement target T when the static electricity sensor 120 measures the static electricity level detected at a specific position of the measurement target T. The distance sensor 140 may provide the measured distance between the integrated sensor 100 and the measurement target T to the processor 200.

The processor 200 may generate a visualization image visually indicating the level of static electricity measured by the static electricity sensor 120.

The processor 200 may receive data of the level of static electricity measured by the static electricity sensor 120 from the static electricity sensor 120. Specifically, when the distance between the integrated sensor 100 and the measurement target T measured by the distance sensor 140 is less than or equal to a threshold value, the processor 200 may receive data regarding the static electricity level measured from the static electricity sensor 120. When the static electricity sensor 120 is aligned at a distance equal to or less than a threshold value from the measurement target T to measure the static electricity level, the processor 200 may use the static electricity level detected at a specific position of the measurement target T to generate a static electricity visualization image. That is, when the static electricity sensor 120 measures the static electricity level detected in the measurement target T at a distance less than or equal to the threshold value, the processor 200 may determine data regarding the static electricity level measured by the static electricity sensor 120 as reliable data, and generate a static electricity visualization image.

The processor 200 may receive an image obtained by the photographing unit 110 photographing the measurement target T from the photographing unit 110. Specifically, the processor 200 may receive a photographed image of the entire image of the measurement target T photographed by the photographing unit 110 in the first mode. The processor 200 may receive a photographed image of a partial image of the measurement target T photographed by the photographing unit 110 in the second mode.

The processor 200 may match the second photographed image including the partial image of the measurement target T in the first photographed image including the entire image of the measurement target T provided from the photographing unit 110. Specifically, the processor 200 may match the second photographed image of the partial image of the measurement target T to the first photographed image of the entire image of the measurement target T by using a template matching algorithm. In this case, 'matching' may refer to calculating where a specific part of the measurement target T included in the second photographed image corresponds to on the first photographed image. That is, the processor 200 may match the photographed image of the partial image of the measurement target T in the photographed image of the entire image of the measurement target T.

The processor 200 may set the mode of the output unit 130. Specifically, the processor 200 may control the output unit 130 to switch between the first mode of outputting a first photographed image including the entire image of the measurement target T and the second mode of outputting a second photographed image including a partial image of the measurement target T.

The processor 200 may determine a color displayed in the static electricity visualization image by using the level of static electricity provided from the static electricity sensor 120. Specifically, the processor 200 determines a color corresponding to the level of static electricity measured by the static electricity sensor 120, and displays the determined color in a position where the second photographed image matches in the first photographed image provided from the photographing unit 110 to generate a static electricity visualization image. This will be described in detail below with reference to FIGS. 3 to 5.

Figure 3:
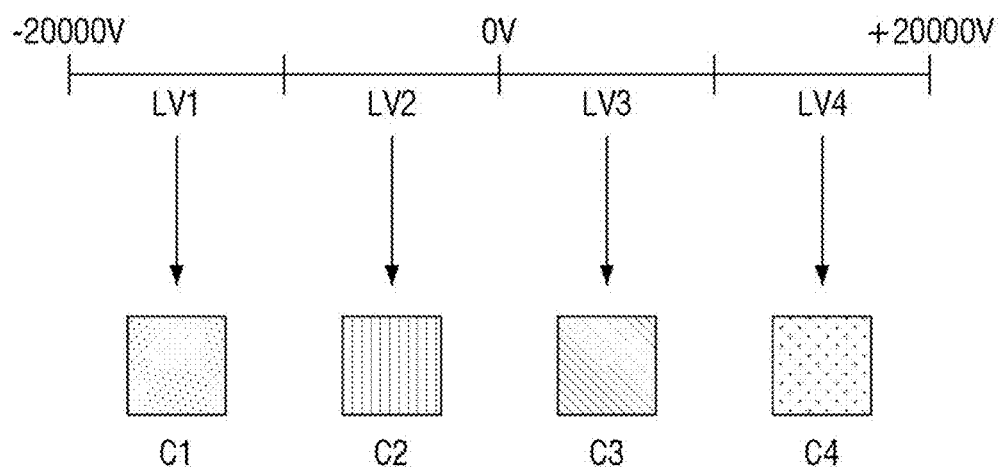
FIGS. 3 to 5 are diagrams for describing an apparatus for static electricity visualization according to an embodiment of the present disclosure.
Figure 4:
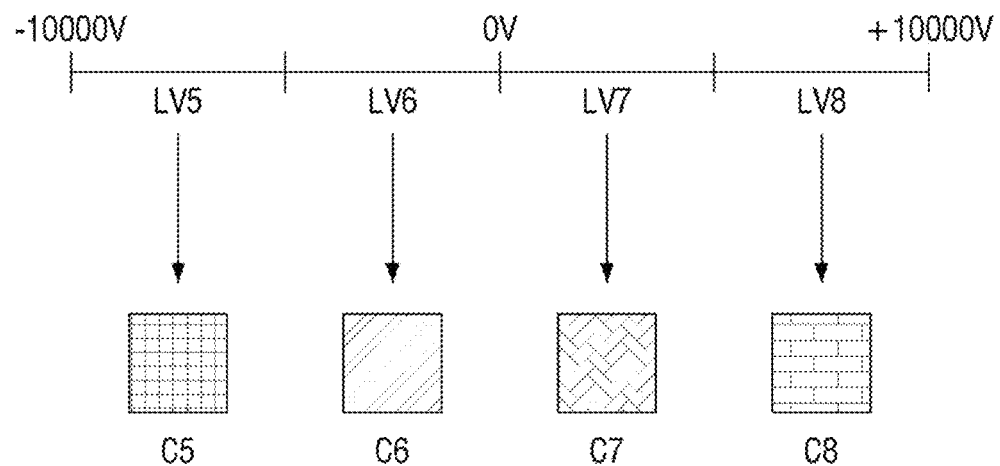
Figure 5:
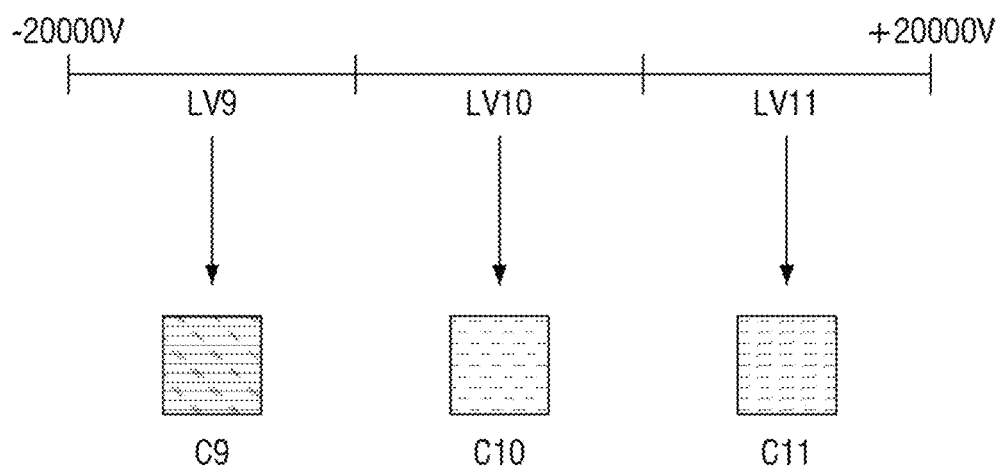

FIGS. 3 to 5 are diagrams for describing an apparatus for static electricity visualization according to an embodiment of the present disclosure.

Referring to FIGS. 3 to 5, the color chart may include a color corresponding to the level of static electricity measured by the static electricity sensor 120. That is, the processor 200 may determine a color corresponding to the level of static electricity provided from the static electricity sensor 120 according to the color chart, and display the determined color on the visualization image output from the output unit 130.

For example, referring to FIG. 3, when the total range of the static electricity level measured by the static electricity sensor 120 is −20000V to +20000V, and the total static electricity level range is divided into four level sections, the first color chart can match the level and color of static electricity.

Accordingly, when the processor 200 determines a color included in the visualization image according to the first color chart, and the level of static electricity measured by the static electricity sensor 120 corresponds to the first level LV1 of the first color chart, the processor 200 may display the first color C1 at a position where the second photographed image is matched in the first photographed image provided from the photographing unit 110. When the level of static electricity measured by the static electricity sensor 120 corresponds to the second level LV2 of the first color chart, the processor 200 may display the second color C2 on a position where the second photographed imaged matches in the first photographed image provided from the photographing unit 110.

Similarly, when the levels of static electricity measured at different positions by the static electricity sensor 120 correspond to the third level LV3 and the fourth level LV4 of the first color chart, the processor 200 may display the third color C3 and the fourth color C4 on positions where the second photographed image matches on the first photographed image provided from the photographing unit 110, respectively.

For another example, referring to FIG. 4, when the total range of the static electricity level measured by the static electricity sensor 120 is −10000V to +10000V, and the total static electricity level range is divided into four level sections, the second color chart can match the level and color of static electricity.

Accordingly, when the processor 200 determines a color included in the visualization image according to the second color chart, and the level of static electricity measured by the static electricity sensor 120 corresponds to the fifth level LV5 of the second color chart, the processor 200 may display the fifth color C5 on the position where the second photographed image matches on the first photographed image provided from the photographing unit 110. When the level of static electricity measured by the static electricity sensor 120 corresponds to the sixth level LV6 of the second color chart, the processor 200 may display the sixth color C6 on the position where the second photograph image matches on the first photographed image provided from the photographing unit 110.

Similarly, when the levels of static electricity measured at different positions by the static electricity sensor 120 correspond to the seventh level LV7 and the eighth level LV8 of the second color chart, respectively, the processor 200 may display the seventh color C7 and the eighth color C8 on positions where the second photographed image matches on the first photographed image provided by the photographing unit 110, respectively.

For another example, referring to FIG. 5, when the total range of the static electricity level measured by the static electricity sensor 120 is −20000V to +20000V, and the total static electricity level range is divided into three level sections, the third color chart can match the level and color of static electricity.

Accordingly, when the processor 200 determines a color included in the visualization image according to the third color chart, and the level of static electricity measured by the static electricity sensor 120 corresponds to the ninth level LV9 of the third color chart, the processor 200 may display the ninth color C9 on the position where the second photographed image matches on the first photographed image provided from the photographing unit 110. When the level of static electricity measured by the static electricity sensor 120 corresponds to the tenth level LV10 of the third color chart, the processor 200 may display the tenth color C10 on a position where the second photographed image matches on the first photographed image provided from the photographing unit 110.

In FIGS. 3 to 5, a case, in which the total static electricity level range measured by the static electricity sensor 120 is divided into four or three level sections, is illustrated, but the embodiment is not limited thereto. According to the total level range of the static electricity measured by the static electricity sensor 120, the number of sections dividing the total level range of the static electricity may vary according to exemplary embodiments.

As the number of sections dividing the total static electricity level range increases, the number of colors corresponding to each section increases. Therefore, the distribution of static electricity levels can be identified in detail through the visualization image.

Figure 6:
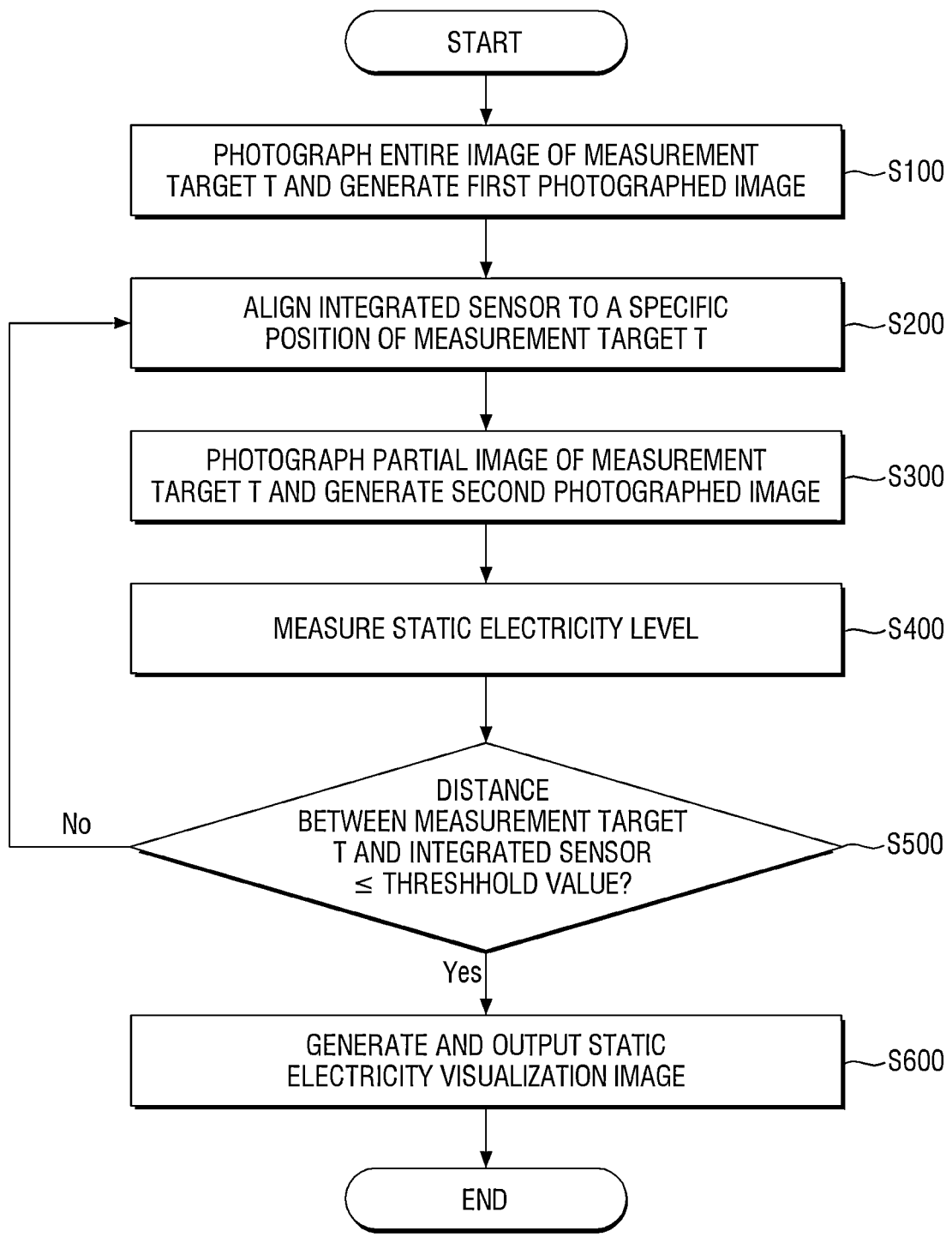
FIG. 6 is a flowchart for describing the operation of the static electricity visualization apparatus according to an embodiment of the present disclosure.

FIG. 6 is a flowchart illustrating an operation of an apparatus for static electricity visualization according to an embodiment of the present disclosure. FIGS. 7 to 10 are diagrams for describing the operation of the static electricity visualization apparatus according to an embodiment of the present disclosure. FIGS. 11 to 15 are diagrams for describing the operation of the static electricity visualization apparatus according to an embodiment of the present disclosure.

Referring to FIGS. 1, 2 and 6, the photographing unit 110 generates a first photographed image by photographing the entire image of the measurement target T (S100). Specifically, the integrated sensor 100 may be installed at a first distance D1 from the measurement target T to photograph an entire image of the measurement target T.

Figure 7:
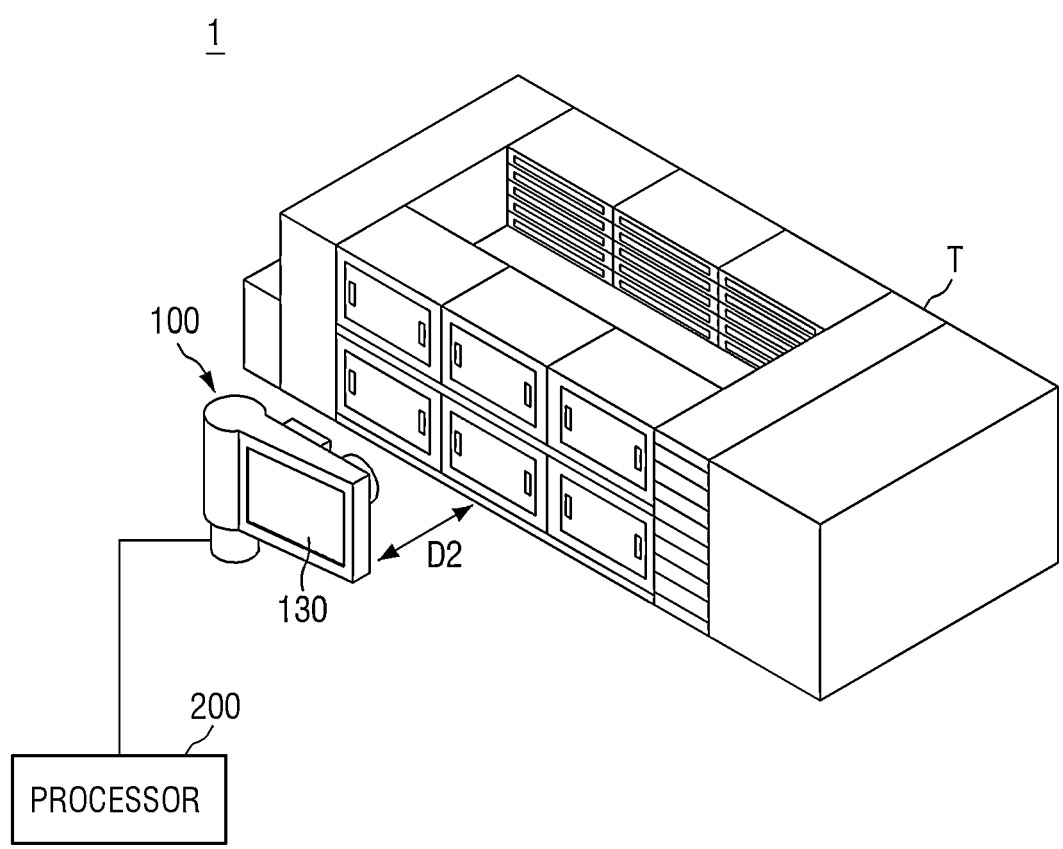
FIGS. 7 to 10 are diagrams for describing the operation of the static electricity visualization apparatus according to an embodiment of the present disclosure.
Figure 8:
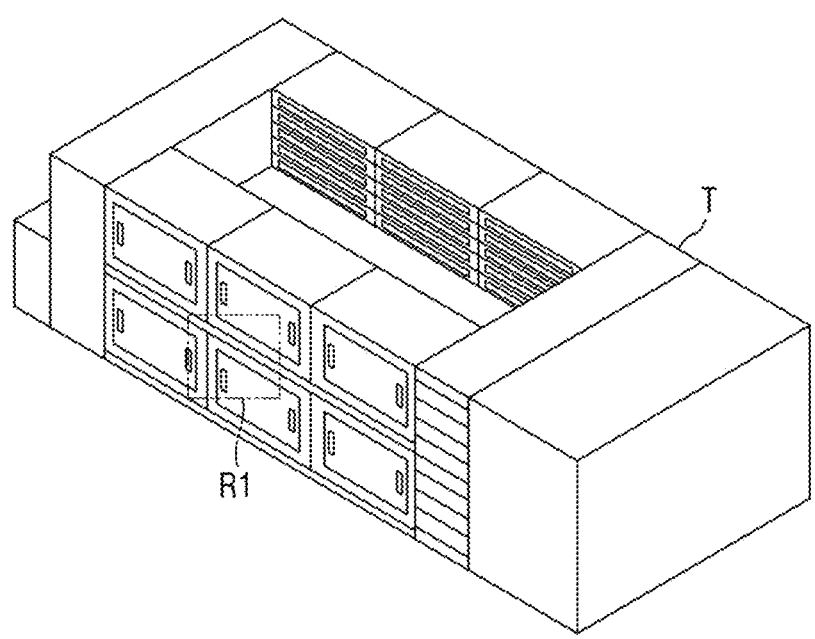
Figure 9:
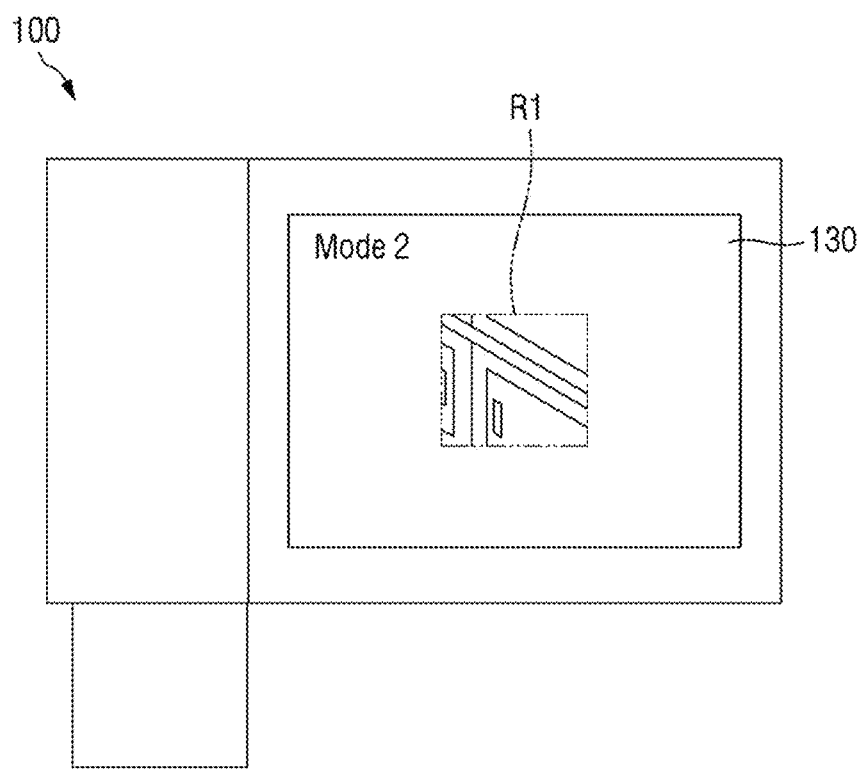

Referring to FIGS. 6 and 7, then, the integrated sensor 100 is aligned to a specific position of the measurement target T (S200). Specifically, the integrated sensor 100 may be installed at the second distance D2 from the measurement target T. In this case, the second distance D2 is smaller than the first distance D1.

Referring to FIGS. 2, 6, 8 and 9, the photographing unit 110 generates a second photographed image by photographing a partial image of the measurement target T (S300). Specifically, at a position of the second distance D2 from the measurement target T, in which the integrated sensor 100 is installed, the photographing unit 110 may photograph only a local portion of the measurement target T. That is, the photographing unit 110 may photograph a partial image of the measurement target T at a specific position where the integrated sensor 100 including the photographing unit 110 is disposed in the second mode.

In this case, the output unit 130 may output the first region R1 including the local portion of the measurement target T photographed by the photographing unit 110 in the second mode. That is, the output unit 130 may output the second photographed image including the first region R1 photographed by the photographing unit 110 in the second mode.

Referring back to FIGS. 2 and 6, the static electricity sensor 120 measures the static electricity level of the measurement target T (S400). Specifically, at a position of the second distance D2 from the measurement target T, in which the integrated sensor 100 is installed, the static electricity sensor 120 may measure the static electricity level of the measurement target T. That is, the static electricity sensor 120 may measure the static electricity level detected at a specific position of the measurement target T, in which the integrated sensor 100 is aligned.

Next, the static electricity visualization apparatus 1 determines whether the distance between the measurement target T and the integrated sensor 100 is less than or equal to a threshold value (S500).

Referring to FIGS. 1, 2, 6, 7 and 10, then, when the distance between the measurement target T and the integrated sensor 100 is less than or equal to a threshold value, the static electricity visualization apparatus 1 generates and outputs the static electricity visualization image (S600). Specifically, when the distance between the measurement target T and the integrated sensor 100 measured by the distance sensor 140 is less than or equal to a threshold value, the processor 200 may generates a static electricity visualization image by displaying a color corresponding to the static electricity level measured by the sensor 120 in the first photographed image generated by the photographing unit 110.

In this case, the processor 200 may match the second photographed image generated by the photographing unit 110 in the first photographed image. That is, the processor 200 may match the first region R1 of the measurement target T photographed as a partial image in the second photographed image on the first photographed image. The processor 200 may match the second photographed image in the first photographed image by using a template matching algorithm.

Figure 10:
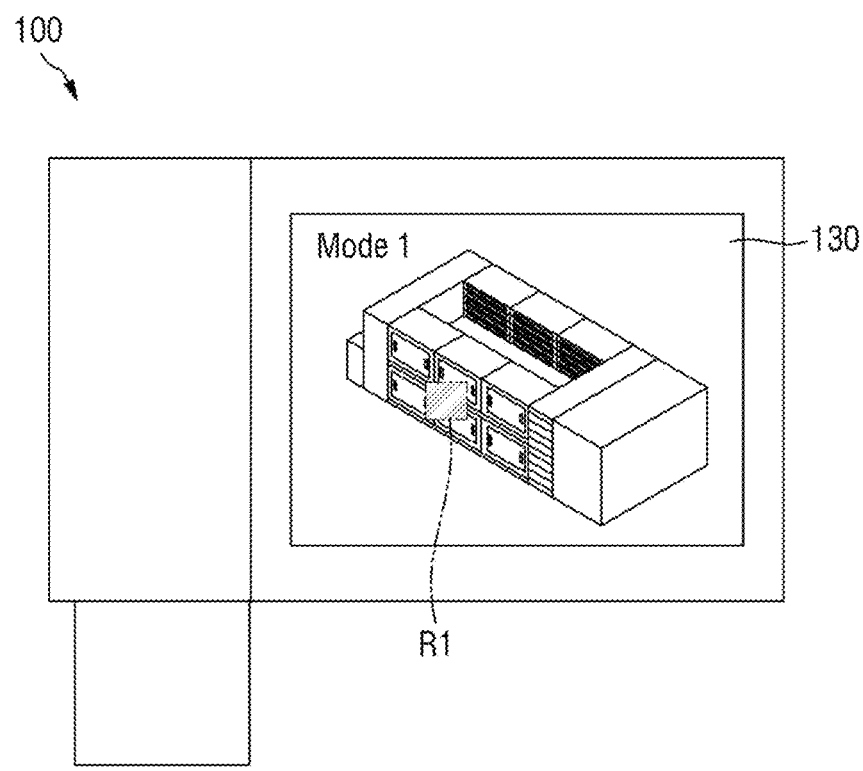

The processor 200 may display a color corresponding to the static electricity level measured by the static electricity sensor 120 at a position where the second photographed image matches in the first photographed image. Referring to FIG. 10, the processor 200 may generate a static electricity visualization image by displaying a color corresponding to the static electricity level in the position where the second photographed image matches in the first photographed image output by the output unit 130 in the first mode, that is, the first region R1 where the static electricity sensor 120 measures the static electricity level.

On the other hand, referring back to FIGS. 2, 6, 11 and 12, when the distance between the measurement target T and the integrated sensor 100 is not less than or equal to the threshold value, the integrated sensor 100 is realigned at a specific position of the measurement target T.

Figure 11:
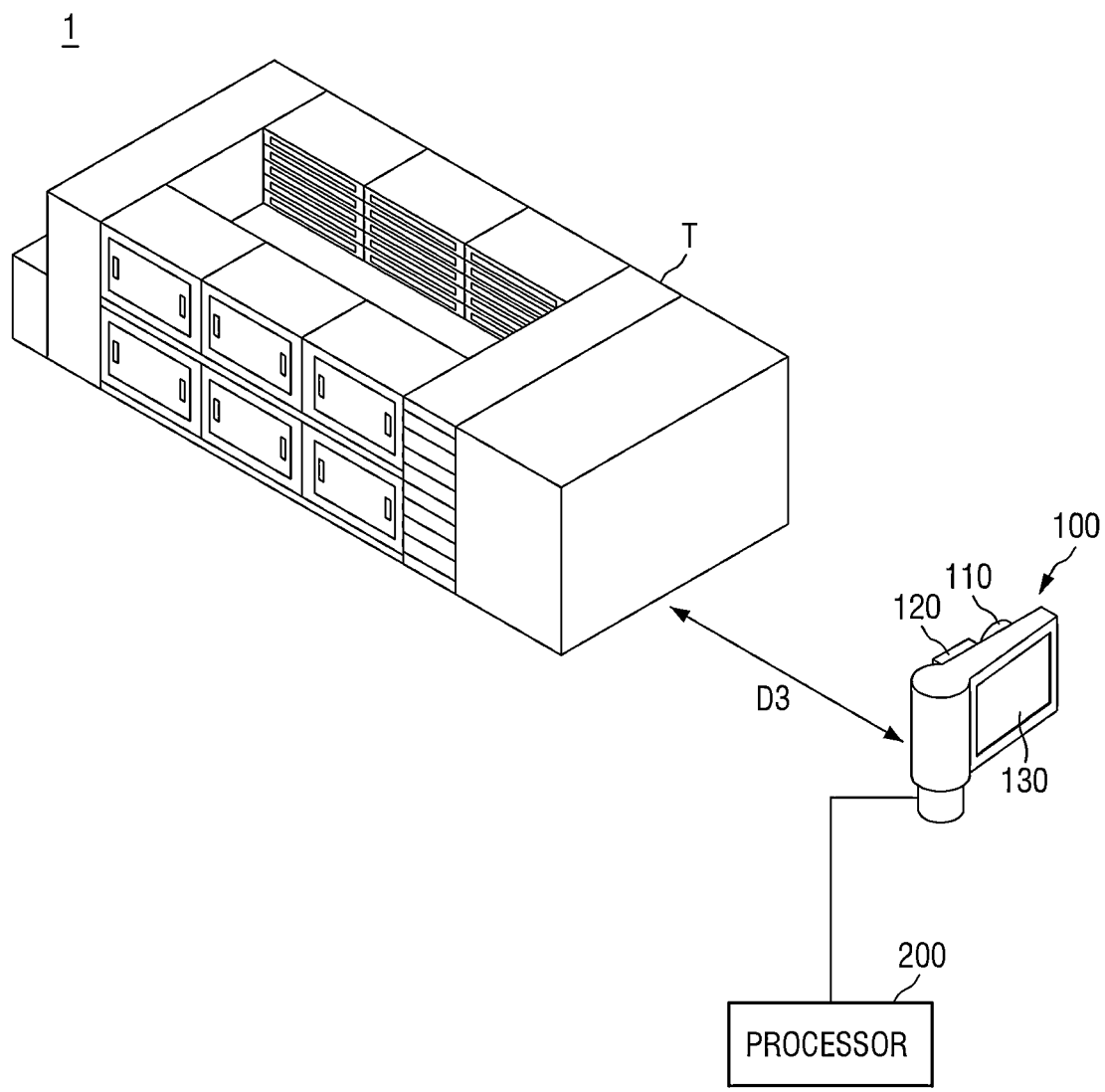
FIGS. 11 to 15 are diagrams for describing the operation of the static electricity visualization apparatus according to an embodiment of the present disclosure.
Figure 12:
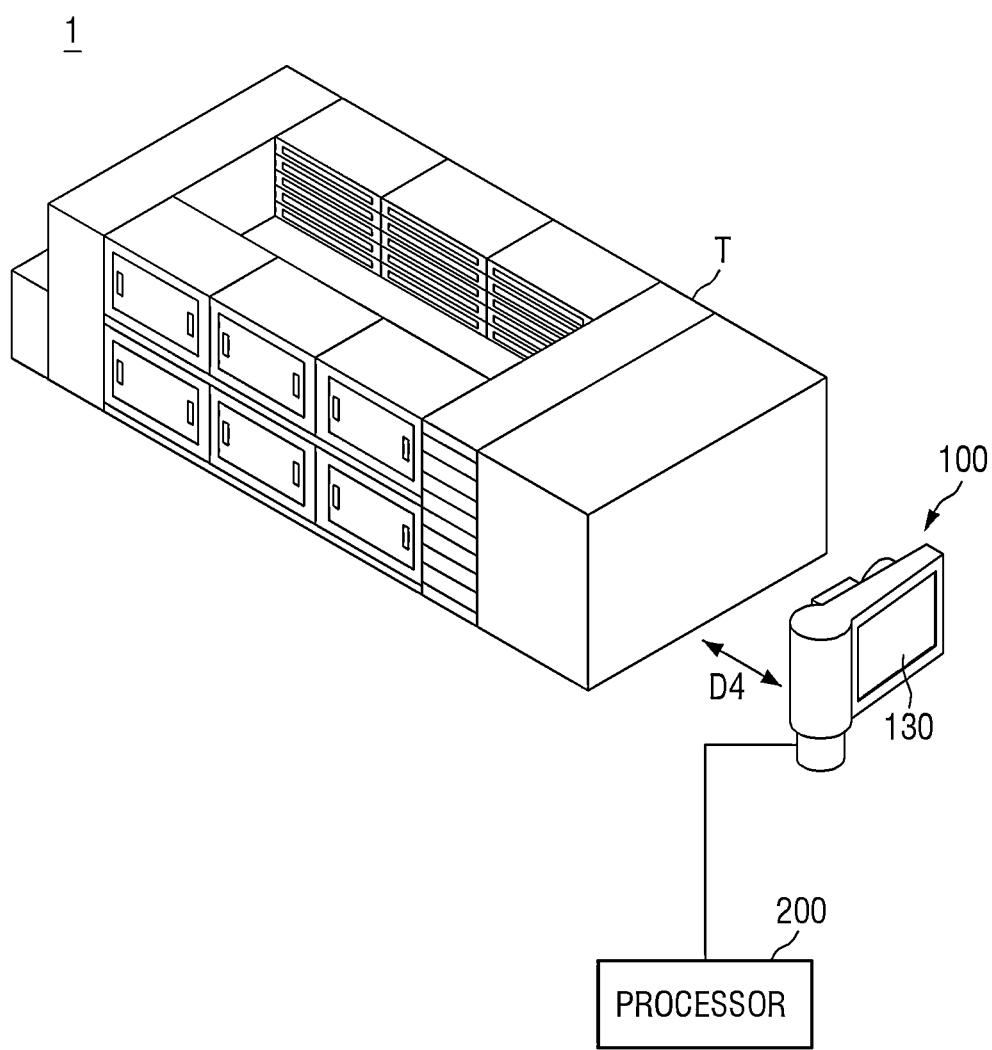

Specifically, referring to FIG. 11, when the distance between the measurement target T and the integrated sensor 100 measured by the distance sensor 140 is the third distance D3 greater than the threshold value, the processor 200 does not generate static visualization images. That is, the processor 200 does not receive data regarding the static electricity level measured from the static electricity sensor 120.

Referring to FIGS. 12 to 15, when the integrated sensor 100 is realigned with respect to the measurement target T, and the distance between the measurement target T and the integrated sensor 100 measured by the distance sensor 140 is the fourth distance D4 equal to or less than a threshold value, the processor 200 may generate a static electricity visualization image by visualizing the static electricity level measured by the static electricity sensor 120 at a position of the fourth distance D4 from the measurement target T.

Figure 13:
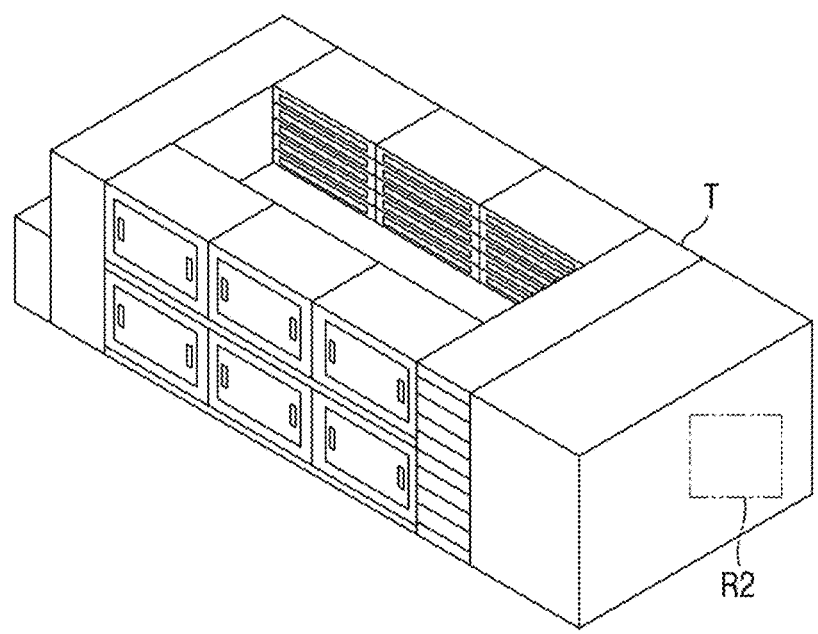
Figure 14:
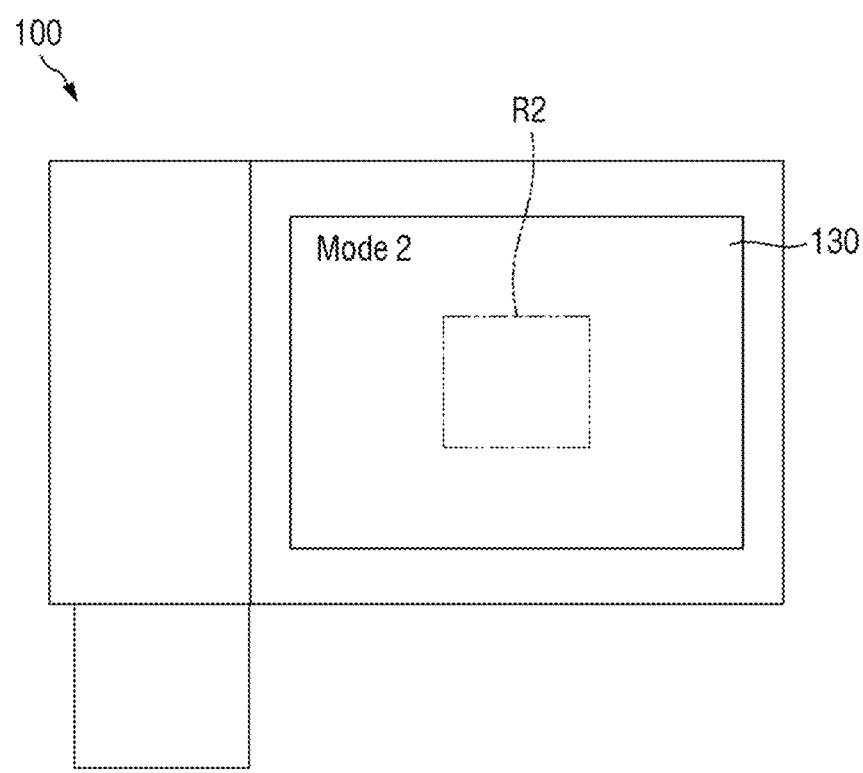

Referring to FIGS. 13 and 14, when the photographing unit 110 photographs the second region R2, which is a local part of the measurement target T, at a position of the fourth distance D4 from the measurement target T, the output unit 130 may output a second photographed image including a partial image of the second region R2 photographed by the photographing unit 110 in the second mode.

Figure 15:
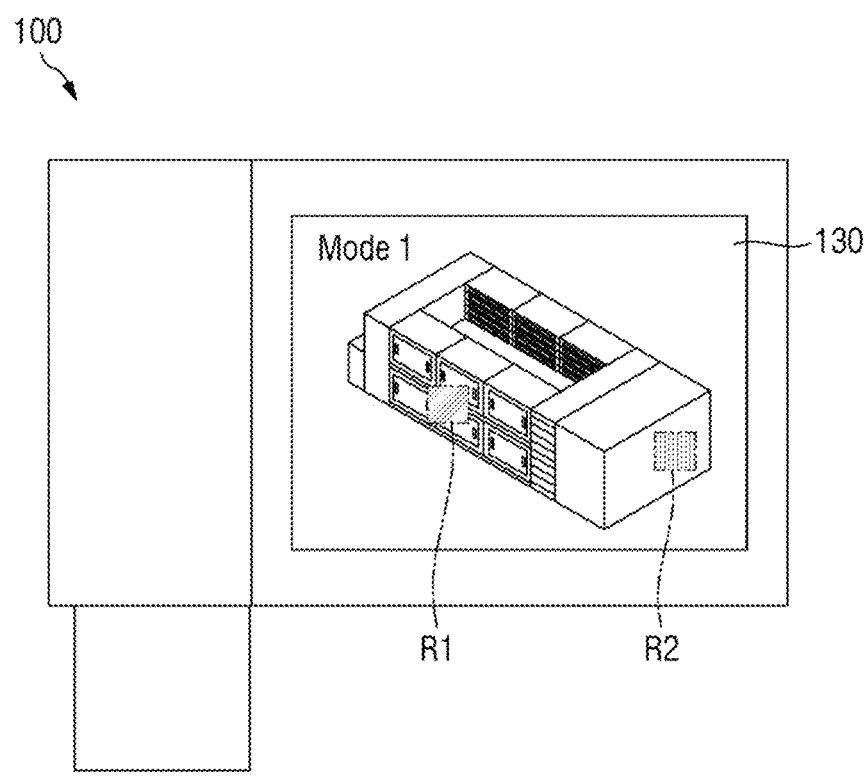

Referring to FIG. 15, the output unit 130 may output a static electricity visualization image, in which a color corresponding to the static electricity level measured by the static electricity sensor 120 is displayed at a position where the second photographed image matches on the first photographed image.

Figure 16:
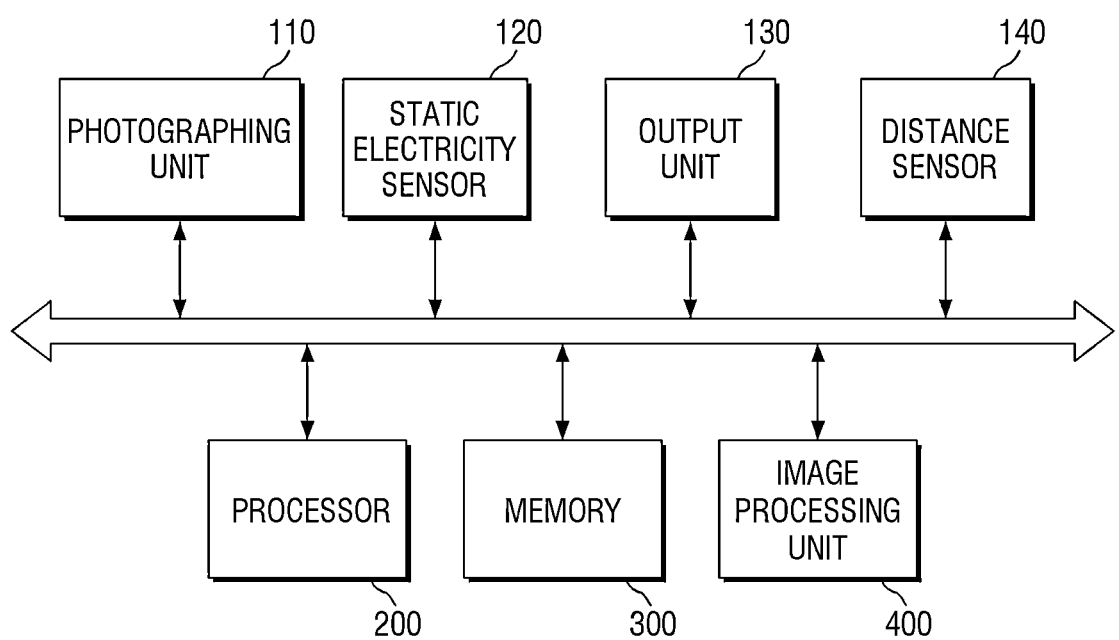
FIG. 16 is a view for describing an apparatus for static electricity visualization according to an embodiment of the present disclosure.

FIG. 16 is a view for describing an apparatus for static electricity visualization according to an embodiment of the present disclosure. For convenience of description, the points different from those described with reference to FIGS. 1 and 2 will be mainly described.

Referring to FIG. 16, the static electricity visualization apparatus 1 may include a photographing unit 110, a static electricity sensor 120, an output unit 130, a distance sensor 140, a processor 200, a memory 300, and an image processing unit 400. The photographing unit 110, the static electricity sensor 120, the output unit 130, the distance sensor 140, and the processor 200 are substantially the same as described above with reference to FIGS. 1 to 15.

The memory 300 may store the level of static electricity measured by the static electricity sensor 120. Also, the memory 300 may store a color chart used by the processor 200. In this case, the processor 200 may receive the color chart stored in the memory 300 to determine a color corresponding to the level of static electricity measured by the static electricity sensor 120.

The memory 300 may include a volatile memory or a non-volatile memory according to an embodiment. By storing data used or calculated by the static electricity visualization apparatus in the memory 300, data stored in the memory 300 may be provided according to a user's request. Accordingly, the user can effectively control static electricity by using static electricity level data stored in the memory 300.

The image processing unit 400 may perform pre-processing on the first photographed image and the second photographed image generated by the photographing unit 110 photographing the measurement target T. The image processing unit 400 performs pre-processing to facilitate the processor 200 to match the second photographed image with the first photographed image and to generate a static electricity visualization image using the first photographed image and the second photographed image. For example, the image processing unit 400 may correct, or improve optical characteristics by performing corrections such as white balance and color adjustment of the first photographed image and the second photographed image generated by the photographing unit 110.

In FIG. 16, the processor 200 and the image processing unit 400 are respectively indicated by different blocks, but the embodiment is not limited thereto. For example, the processor 200 may include the image processing unit 400.

Although embodiments of the present disclosure have been described with reference to the above and the accompanying drawings, those skilled in the art, to which the present disclosure pertains, can understand that the present disclosure may be practiced in other specific forms without changing its technical spirit or essential features. Therefore, it should be understood that the embodiments described above are illustrative in all respects and not limiting.

What is claimed is:

1. An apparatus for static electricity visualization comprising:
    a photographing unit for generating a first photographed image obtained by photographing a measurement target at a first distance from the measurement target in a first mode, and generating a second photographed image obtained by photographing the measurement target at a second distance from the measurement target in a second mode;
    a static electricity sensor for measuring a static electricity level of the measurement target at the second distance from the measurement target;
    a processor for matching the second photographed image with the first photographed image; and
    an output unit for outputting a static electricity visualization image that visualizes a static electricity level measured by the static electricity sensor on the first photographed image,
    wherein the static electricity visualization image comprises a color corresponding to the static electricity level of the measurement target measured by the static electricity sensor at a position where the second photographed image matches on the first photographed image.

2. The apparatus of claim 1 further comprises,
    a distance sensor for measuring a distance between the measurement target and the static electricity sensor,
    wherein the static electricity sensor, in response to the second distance between the measurement target and the static electricity sensor being equal to or less than a threshold value, provides data for the measured static electricity level to the processor.

3. The apparatus of claim 2 further comprises,
    an integrated sensor including the photographing unit, the static electricity sensor, the output unit, and the distance sensor,
    wherein the processor controls the integrated sensor.

4. The apparatus of claim 1, wherein the first distance is greater than the second distance.

5. The apparatus of claim 1 further comprises,
an image processing unit for pre-processing the first photographed image and the second photographed image.

6. The apparatus of claim 1, wherein the processor matches the second photographed image on the first photographed image by using a template matching algorithm.

7. The apparatus of claim 1, wherein the processor receives the first photographed image and the second photographed image from the photographing unit, and receives data for the static electricity level measured from the static electricity sensor, and generates the static electricity visualization image, in which a color corresponding to the static electricity level measured by the static electricity sensor is displayed at a position where the second photographed image matches on the first photographed image.

8. The apparatus of claim 7 further comprises,
a memory for storing color data corresponding to a static electricity level measured by the static electricity sensor,
wherein the processor generates the static electricity visualization image by using the color data stored in the memory.

9. The apparatus of claim 1, wherein the output unit outputs a static electricity level of the measurement target measured by the static electricity sensor as a numerical value.

10. An apparatus for static electricity visualization comprising:
an integrated sensor including a photographing unit, a static electricity sensor and an output unit; and
wherein the photographing unit for generating a first photographed image obtained by photographing an entire image of a measurement target in a first mode, and generating a second photographed image obtained by photographing a partial image including a specific position of the measurement target in a second mode,
wherein the static electricity sensor for measuring a static electricity level at the specific position of the measurement target, and
wherein the output unit for outputting a static electricity visualization image that visualizes a static electricity level measured by the static electricity sensor on the first photographed image, and
a processor for controlling the integrated sensor and matching the second photographed image with the first photographed image,
wherein the static electricity visualization image comprises a color corresponding to a static electricity level of the measurement target measured by the static electricity sensor at a position where the second photographed image matches on the first photographed image.

11. The apparatus of claim 10, wherein the integrated sensor further comprises a distance sensor measuring a distance between the measurement target and the static electricity sensor.

12. The apparatus of claim 11, wherein the electrostatic sensor, in response to a distance between the measurement target and the static electricity sensor measured by the distance sensor being less than or equal to a threshold value, provides data regarding the static electricity level to the processor.

13. The apparatus of claim 10, wherein the processor matches the second photographed image on the first photographed image by using a template matching algorithm.

14. The apparatus of claim 10 further comprises,
an image processing unit for pre-processing the first photographed image and the second photographed image.

15. The apparatus of claim 10, wherein the processor receives the first photographed image and the second photographed image from the photographing unit, receives data for the static electricity level measured from the static electricity sensor, generates the static electricity visualization image, in which a color corresponding to a static electricity level measured by the static electricity sensor is displayed at a position where the second photographed image matches on the first photographed image, and provides the generated static electricity visualization image to the output unit.

16. The apparatus of claim 15 further comprises
a memory for storing color data corresponding to a static electricity level measured by the static electricity sensor,
wherein the processor generates the static electricity visualization image by using the color data stored in the memory.

17. The apparatus of claim 10, wherein the static electricity sensor measures a static electricity level at the specific position of the measurement target in response to the photographing unit photographing the partial image to generate the second photographed image.

18. An apparatus for static electricity visualization comprising:
an integrated sensor including a photographing unit, a static electricity sensor, an output unit and a distance sensor; and
the photographing unit for generating a first photographed image obtained by photographing an entire image of a measurement target in a first mode, and generating a second photographed image obtained by photographing a partial image including a specific position of the measurement target in a second mode,
the static electricity sensor for measuring a static electricity level at the specific position of the measurement target,
the output unit for outputting a static electricity visualization image, in which a static electricity level measured by the static electricity sensor is visualized on the first photographed image,
the distance sensor for measuring a distance between the measurement target and the static electricity sensor,
a processor for controlling the integrated sensor and matching the second photographed image with the first photographed image,
wherein the static electricity sensor, in response to a distance between the measurement target and the static electricity sensor measured by the distance sensor being less than or equal to a threshold value, provide data for the static electricity level to the processor,
wherein the processor receives the first photographed image and the second photographed image from the photographing unit, receives data for the static electricity level measured from the static electricity sensor, generates the static electricity visualization image, in which a color corresponding to a static electricity level measured by the static electricity sensor is displayed at a position where the second photographed image matches on the first photographed image, and provides the generated static electricity visualization image to the output unit.

19. The apparatus of claim 18, wherein the processor matches the second photographed image on the first photographed image by using a template matching algorithm.

20. The apparatus of claim 18, wherein the static electricity sensor, in response to the photographing unit photographing the partial image to generate the second photographed image, measures a static electricity level at the specific position of the measurement target.

* * * * *